(12) United States Patent
Elsayed et al.

(10) Patent No.: US 8,922,418 B2
(45) Date of Patent: Dec. 30, 2014

(54) CLOCKED REFERENCE BUFFER IN A SUCCESSIVE APPROXIMATION ANALOG-TO-DIGITAL CONVERTER

(71) Applicants: Mohamed Elsayed, Austin, TX (US); Xiaodong Wang, Austin, TX (US); Shouli Yan, Austin, TX (US)

(72) Inventors: Mohamed Elsayed, Austin, TX (US); Xiaodong Wang, Austin, TX (US); Shouli Yan, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 0 days.

(21) Appl. No.: 13/892,235

(22) Filed: May 10, 2013

(65) Prior Publication Data

US 2014/0333465 A1    Nov. 13, 2014

(51) Int. Cl.
*H03M 1/12* (2006.01)

(52) U.S. Cl.
CPC .................................. *H03M 1/124* (2013.01)
USPC .......................................... 341/172; 341/155

(58) Field of Classification Search
CPC ....... H03M 1/46; H03M 1/804; H03M 1/124; H03K 5/249
USPC .......... 341/122, 118, 120, 144, 155, 163, 135
See application file for complete search history.

(56) References Cited

U.S. PATENT DOCUMENTS

| | | | | |
|---|---|---|---|---|
| 5,394,148 A * | 2/1995 | Matsuura et al. | | 341/162 |
| 5,565,813 A * | 10/1996 | Connell et al. | | 330/9 |
| 6,867,724 B2 * | 3/2005 | Colonna et al. | | 341/172 |
| 7,907,074 B2 * | 3/2011 | Zanchi et al. | | 341/155 |
| 7,961,132 B1 * | 6/2011 | Perry et al. | | 341/172 |
| 8,350,740 B2 * | 1/2013 | Akita | | 341/122 |
| 8,456,340 B2 * | 6/2013 | Kapusta et al. | | 341/144 |
| 8,487,795 B1 * | 7/2013 | Jiang et al. | | 341/122 |
| 8,610,422 B2 * | 12/2013 | Figueiredo et al. | | 323/315 |

* cited by examiner

*Primary Examiner* — Peguy Jean Pierre
(74) *Attorney, Agent, or Firm* — Cesari & Reed LLP; R. Michael Reed

(57) ABSTRACT

A voltage reference circuit includes a capacitor including a first terminal and including a second terminal coupled to a power supply node. The voltage reference circuit further includes an amplifier, a first transistor, and a switch. The amplifier includes a first input configured to receive a reference voltage input signal, a second input configured to receive a feedback signal, and an output. The first transistor includes a source coupled to the second input of the amplifier and to an output node, a gate coupled to the capacitor, and a drain. The first transistor is configured to provide a reference voltage at the source based on a charge provided to the gate by the capacitor. The switch includes a first terminal coupled to the output of the amplifier, and includes a second terminal coupled to the first terminal of the capacitor.

19 Claims, 4 Drawing Sheets

US 8,922,418 B2

CLOCKED REFERENCE BUFFER IN A SUCCESSIVE APPROXIMATION ANALOG-TO-DIGITAL CONVERTER

FIELD

The present disclosure is generally related to analog-to-digital converter (ADC) circuits, and more particularly to reference voltages and bias currents within such circuits.

BACKGROUND

In electronic circuits, reference voltages and bias currents may be used to control operation of various circuit components, including transistors, comparators, and other circuit elements. Noise or glitches in such voltages and/or currents can adversely affect operation of the circuit by introducing errors, for example, in comparator outputs, such as those associated with an analog-to-digital converter. In some circuits, to avoid such errors, circuitry may include delay circuitry to allow time for the reference voltage signal or bias current to settle (i.e., become stable) so that the circuitry may function correctly.

SUMMARY

In an embodiment, a voltage reference circuit includes a transistor including a source coupled to an output node configured to provide a reference voltage, and including a gate, and a drain. The voltage reference circuit further includes a capacitor coupled to the gate and a switch configured to selectively provide a voltage to the capacitor during a first phase of an analog-to-digital converter (ADC) conversion operation and to decouple the voltage from the capacitor during a second phase of the ADC conversion operation.

In another embodiment, a method of providing a reference voltage includes closing a switch during a sampling phase of an ADC conversion operation to sample a voltage onto a capacitor of an output stage. The capacitor is coupled to a gate of a transistor that is coupled to an output node. The method further includes opening the switch during a conversion phase of the ADC conversion operation to isolate the capacitor from the voltage and biasing the transistor using charge stored on the capacitor to provide the reference voltage at the output node during the conversion phase.

In still another embodiment, a reference circuit includes a reference voltage output stage including a transistor including a drain coupled to an output node, a gate, and a source and including a capacitor coupled to the gate. The reference voltage output stage further includes a switch coupled to the capacitor and configured to selectively couple a voltage to the capacitor during a sampling phase of an ADC operation. A charge stored on the capacitor biases the gate of the transistor to provide a regulated voltage on the output node during a conversion phase of the ADC operation.

BRIEF DESCRIPTION OF THE DRAWINGS

In the following discussion, the same reference numbers are used in the various embodiments to indicate the same or similar elements.

DETAILED DESCRIPTION OF ILLUSTRATIVE EMBODIMENTS

Embodiments of a clocked reference buffer are described below that achieve high-speed settling and high-accuracy in a fast switching environment, such as an SAR ADC. In an example, the clocked reference buffer suppresses the noise of the bias current generators as well as noise from the voltage regulator. Further, the buffer loop improves the power supply rejection ratio (PSRR) without adding noise to the system. One possible example of an SAR ADC circuit is described below with respect to FIG. 1.

Figure 1:
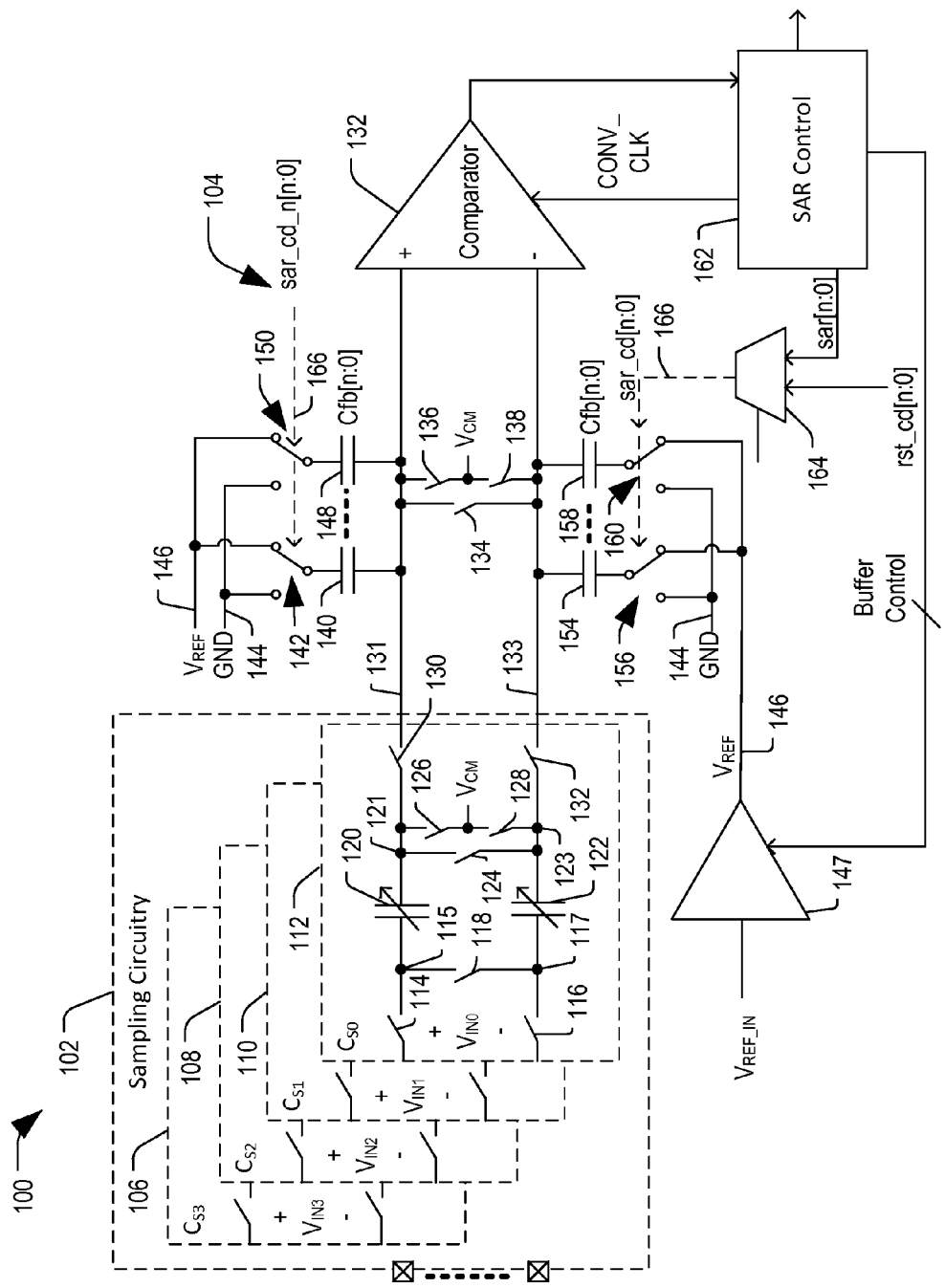
FIG. 1 is a diagram of a successive approximation register (SAR) analog-to-digital converter (ADC) including a clocked buffer according to an embodiment.

FIG. 1 is a diagram of an SAR ADC 100 including a clocked buffer 147 according to an embodiment. SAR ADC 100 includes sampling circuitry 102 and feedback circuitry 104. Sampling circuitry 102 includes multiple capacitive sampling circuits 106, 108, 110, and 112 (labeled "$C_{S3}$", "$C_{S2}$", "$C_{S1}$", and "$C_{S0}$"). While the illustrated embodiment depicts four capacitive sampling circuits 106, 108, 110, and 112, sampling circuitry 102 may include any number of capacitive sampling circuits. Each of the multiple sampling circuits 106, 108, 110, and 112 may be coupled to a signal source (such as a conductive trace or circuit) configured to provide a signal.

Capacitive sampling circuit 112 includes a switch 114 coupled between a pin or pad and a node 115. Capacitive sampling circuit 112 further includes a switch 116 coupled between a pin or pad and a node 117. Capacitive sampling circuit 112 includes a switch 118 coupled between node 115 and node 117. Capacitive sampling circuit 112 further includes a capacitor 120 coupled between node 115 and a node 121. Capacitive sampling circuit 112 further includes a capacitor 122 coupled between node 117 and a node 123. Capacitive sampling circuit 112 includes a switch 124 coupled between node 121 and node 123. Further, capacitive sampling circuit 112 includes a switch 126 coupled between node 121 and a bias node (labeled "$V_{CM}$"), which may be configured to provide a sample common mode signal. Capacitive sampling circuit 112 further includes a switch 128 coupled between the bias terminal and node 123. Capacitive sampling circuit 112 further includes a conversion switch 130 coupled between node 121 and a node 131, and includes a conversion switch 132 coupled between node 123 and node 133. Capacitive sampling circuits 106, 108, and 110 have similar switches and capacitors to provide the same functionality as capacitive sampling circuit 112 for a different set of inputs.

Feedback circuitry 104 includes a comparator 132 including a positive input coupled to node 131 and a negative input coupled to node 133. Feedback circuitry 104 further includes a switch 134 coupled between node 131 and node 133. When switch 134 is closed, switch 134 shorts the inputs of comparator 132. Feedback circuitry 104 further includes a switch 136 coupled between node 131 and a bias terminal (labeled "$V_{CM}$"), which is configured to provide a common mode voltage that can be used to reset the feedback capacitors. Feedback circuitry 104 also includes a switch 138 coupled between node 133 and the bias terminal.

Feedback circuitry 104 further includes a feedback capacitor 140 coupled between node 131 and a first terminal of a switch 142, which has a second terminal coupled to a node 144 (labeled "GND") and a third terminal coupled to a reference a reference node 146 (labeled "$V_{REF}$"). In the illustrated embodiment, node 144 may be a power supply terminal to provide a reference signal, such as a second reference voltage rather than ground. In an embodiment, nodes 144 and 146 provide first and second reference voltages. In another embodiment, node 144 provides a negative reference voltage, and reference node 146 provides a positive reference voltage.

Feedback circuitry 104 further includes a feedback capacitor 148 coupled between node 131 and a first terminal of a switch 150, which has a second terminal coupled to node 144 and a third terminal coupled to reference node 146. While two feedback capacitors 140 and 148 are shown, feedback circuitry 104 may include any number of feedback capacitors.

Feedback circuitry 104 includes a capacitor 154 coupled between node 133 and a first terminal of a switch 156, which has a second terminal coupled to node 144 and a third terminal coupled to a reference node 146. Feedback circuitry 104 also includes a capacitor 158 coupled between node 133 and a first terminal of a switch 160, which has a second terminal coupled to node 144, and a third terminal coupled to reference node 146. While two capacitors 154 and 158 are shown, feedback circuitry 104 may include any number of capacitors.

Comparator 132 includes an output coupled to a successive approximation register (SAR) control circuit 162, which includes an output coupled to an input of a multiplexer 164 to provide an SAR signal labeled "sar[n:0]". Multiplexer 164 includes a second input configured to receive a reset code (labeled "rst_cd[n:0]"), a control input to receive a select signal, and an output 166 configured to provide a switch control signal (labeled "sar_cd[n:0]" to switches 156 and 160. Additionally, the SAR control circuit 162 provides an inverted version of the SAR switch control signal (labeled "sar_cd_n[n:0]") to switches 142 and 150. SAR control circuit 162 further includes an output configured to provide a control signal, which may include an ADC clock and one or more switch control signals for controlling switches within clocked reference buffer 147.

By controlling timing of the switches within circuit 100, circuit 100 may achieve a relatively high ADC throughput rate ($f_{ADC}$) while each input can have three times the conversion time for tracking. In other words, the input has three times more time for tracking as compared to conversion time. Without the multiple capacitive sampling circuits 106, 108, 110, and 112, the ADC data rate would be cut to one-fourth for the same tracking time. Further, circuit 100 provides a fully-differential ADC providing improved common-mode rejection over a single-input implementation. Additionally, circuit 100 provides an expanded single-ended mode having double the single-ended full-range in a differential ADC topology as explained below.

Using capacitive sampling circuit 112 as an example, the improved common mode rejection and expanded single-ended mode can be explained using a charge analysis at the comparator input over different phases. In the following example, four groups of switches are discussed, including sampling switches 114 and 116 on the input side and switches 124, 126, and 128 on the amplifier (comparator) side, capacitive feedback reset switches 134, 136 and 138, conversion switches 130, 132 and 118, and SAR-controlled switches 142, 150, 156, and 160.

In a sampling phase, sampling switches 114, 116, 124, 126, and 128 are closed, conversion switches 118, 130 and 132 are opened, and capacitive feedback reset switches 134, 136 and 138 are closed. Further, the SAR switch control signal controls SAR-controlled switches 142, 150, 156, and 160 to provide an equivalent of half of the reference voltage ($V_{REF}$/2) on the $V_{REF}$-side terminals of capacitors 140, 148, 154, and 158. The charge stored on the terminals of capacitor 120 coupled to conversion switch 130 can be determined according to the following equation:

$$Q_{C120} = C_{Cs\theta} * (V_{CM} - C_{IN+}) \quad (1)$$

The charge stored on the terminals of capacitor 122 coupled to conversion switch 132 can be determined according to the following equation:

$$Q_{C122} = C_{Csa} * (C_{CM} - V_{IN-}) \quad (2)$$

The charges ($Q_{fb}$) stored on the terminals of capacitors 140, 148, 154, and 158 coupled to nodes 131 and 133 can be determined according to the following equation:

$$Q_{fb+} = Q_{fb-} = C_{fb_{sum}} * \left(V_{CM} - \frac{V_{REF}}{2}\right) \quad (3)$$

where the charge ($Q_{fb+}$) refers to the charge on node 131 and the charge ($Q_{fb-}$) refers to the charge on node 133.

At the beginning of a conversion phase, sampling switches 114 and 116 on the input side and switches 124, 126, and 128 on the amplifier side are opened, capacitive feedback reset switches 134, 136 and 138 are opened, and conversion switches 130, 132, and 118 are closed. SAR switch control signal controls SAR-controlled switches 142, 150, 156, and 160 to maintain the equivalent of half of the reference voltage ($V_{REF}$/2) on the $V_{REF}$-side terminals of feedback capacitors 140, 148, 154, and 158. The charge at the comparator input side of capacitor 120 can be determined according to the following equation:

$$Q_{C120} = C_{Cs0} * \left(V_{Node_{185}} - \frac{V_{IN+} + V_{IN-}}{2}\right) \quad (4)$$

The charge at the comparator input side of capacitor 122 can be determined according to the following equation:

$$Q_{C122} = C_{Cs0} * \left(V_{Node_{185}} - \frac{V_{IN+} + V_{IN-}}{2}\right) \quad (5)$$

The charge at the side of feedback capacitors 140 and 148 coupled to the positive input of comparator 132 can be determined according to the following equation:

$$Q_{fb+} = C_{fb_{sum}} * \left(V_{Node_{122}} - \frac{V_{REF}}{2}\right) \quad (6)$$

The charge at the side of feedback capacitors 154 and 158 coupled to the negative input of comparator 132 can be determined according to the following equation:

$$Q_{fb-} = C_{fb_{sum}} * \left(V_{Node_{122}} - \frac{V_{REF}}{2}\right) \quad (7)$$

In operation, the charge is conserved at the comparator input (i.e., $Q_{comp\_input+} = Q_{C120} + Q_{fb+}$; and $Q_{comp\_input-} = Q_{C122} + Q_{fb-}$). Charge is conserved because the capacitors 120 and 122 and on feedback capacitors 140, 146, 154, and 158 store the charge during both the sampling and conversion phases of the ADC. In other words, the charges at the inputs of comparator 132 are the same during the sampling phase and conversion phase. By evaluating the equations, the voltage at the positive input of comparator 132 may be determined according to the following equation:

$$V_{CMP+} = V_{CM} - \frac{\left(\frac{V_{IN+} - V_{IN-}}{2}\right)}{1 + \frac{C_{fb_{sum}}}{C_{S0}}} \quad (8)$$

The voltage at the negative input of comparator 132 may be determined according to the following equation:

$$V_{CMP-} = V_{CM} + \frac{\left(\frac{V_{IN+} - V_{IN-}}{2}\right)}{1 + \frac{C_{fb_{sum}}}{C_{S0}}} \quad (9)$$

Thus, the common-mode of the comparator voltage ($V_{CMP}$) is constant at $V_{CM}$ from sampling phase to conversion phase, and the rejection to the input common-mode variation may be improved.

The charge on the feedback capacitors (140 and 148) at the sampling phase is determined according to the following equation:

$$Q_{fb+} = C_{fb_{sum}} * (V_{CM} - 0) \quad (10)$$

The charge on the feedback capacitors (154 and 158) at the sampling phase is determined according to the following equation:

$$Q_{fb-} = C_{fb_{sum}} * (V_{CM} - V_{REF}) \quad (11)$$

The SAR control signal (sar_cd[n:0]) is changed to the normal configuration at the beginning of conversion phase. A similar charge analysis as discussed above, the voltage at the positive input of comparator 132 is determined according to the following equation:

$$V_{CMP+} = V_{CM} - \frac{\left(V_{IN+} - V_{IN-} - \frac{V_{REF} * C_{fb_{sum}}}{C_{S0}}\right)}{1 + \frac{C_{fb_{sum}}}{C_{S0}}} \quad (12)$$

The voltage at the negative input of comparator 132 may be determined according to the following equation:

$$V_{CMP+} = V_{CM} + \frac{\left(V_{IN+} - V_{IN-} - \frac{V_{REF} * C_{fb_{sum}}}{C_{S0}}\right)}{1 + \frac{C_{fb_{sum}}}{C_{S0}}} \quad (13)$$

This is equivalent of shifting the single-ended input down by a ratio of the reference voltage multiplied by the sum of the feedback capacitances divided by the total capacitance of the capacitive sampling circuit ($C_{S0}$) (i.e., $$\left(\text{i.e., } \frac{V_{REF} * C_{fb_{sum}}}{C_{S0}}\right),$$

and shifting the full-scale range of the single-ended input can be recovered as a range from 0 to twice the above value, i.e., $$\frac{V_{REF} * 2 * C_{fb_{sum}}}{C_{S0}}.$$

It should be noted that the described shifting technique can also be used to shift the input range by any arbitrary value between the voltage rails (i.e., $-V_{REF} \leq X \leq V_{REF}$) to address input ranges that are not centered at zero, either differential or single-ended. Thus, the charges on feedback capacitors 140, 148, 154, and 158 may be configured to level-shift the signal to re-center the signal or to otherwise adjust the signal according to a selected value.

In an embodiment, during a feedback reset phase, conversion switches 118, 130, and 132 are open, feedback reset switches 134, 136, and 138 are closed, and SAR control circuit 162 controls switches 142, 150, 156, and 160 to apply a selected signal to each of the capacitors 140, 148, 154, and 158. In the illustrated embodiment, switch 134 may be redundant to switches 136 and 138; however, switch 134 may be used to short the inputs of comparator 132 to speed the reset operation. In some implementations, switch 134 may be omitted.

In a sample phase, switches 114, 116, 124, 126, and 128 are closed and switches 118, 130 and 132 are open. Switches 124, 126, and 128 operate to place a bias signal on second terminals of capacitors 120 and 122, and switches 114 and 116 provide first and second input signals from nodes to first terminals of capacitors 120 and 122. During a conversion phase, switches 114, 116, 124, 126, and 128 are open, and switches 118, 130, and 132 are closed. During this phase, switch 118 shorts the first terminals of capacitors 120 and 122, shifting the input signals to nodes 131 and 133, which are coupled to the positive and negative inputs of comparator 132, respectively.

In a single-input implementation, switch 114 may couple node 115 to an input signal, and switch 116 may couple node 117 to a power supply terminal, such as ground. In this instance, during conversion, switch 118 is closed, placing the first terminals of capacitors 120 and 122 at a common mode voltage and shifting the charge to nodes 131 and 133 and to the positive and negative inputs of comparator 132.

Regardless of whether the inputs are single-ended or differential, the multiple capacitive sampling circuits 106, 108, 110, and 112 allow a high data rate for the ADC circuit, with each input having 3 times the ADC conversion time for tracking. The differential version has the further benefit of reducing or eliminating common mode error.

Circuit 100 further includes a reference buffer 147 including an input configured to receive a reference input voltage (labeled "$V_{REF\_IN}$"), a buffer control input coupled to an output of SAR control circuit 162, and an output coupled to reference node 146. Reference buffer 147 provides a switching buffer architecture that achieves high-speed settling and high-accuracy in a fast switching environment. Reference buffer 147 is configured to sample a reference voltage ($V_{REF\_IN}$) onto a capacitor (such as capacitor 242 in FIG. 2) configured to drive a transistor (such as transistor 248 in FIG. 2) to provide a regulated voltage signal. Reference buffer 147 is further configured to sample a bias signal onto a capacitor (such as capacitor 276 in FIG. 2) configured to drive a transistor (such transistor 278 in FIG. 2) to provide a bias current. Further, reference buffer 147 is configured to sample a reference voltage signal onto a capacitor (such as capacitor 232 in FIG. 2) that drives an output transistor (such as transistor 234) to produce a reference voltage. By controlling timing of the sampling operations and by storing charge onto the capacitors to drive the transistors, the settle time is improved, reducing settle-time induced delays in the ADC conversion, since the reference voltage output becomes stable very quickly. In circuit 100, reference buffer 147 can be synchronized with the ADC using the buffer control signal to achieve high speed settling during the ADC conversion phase. An embodiment of reference buffer 147 is described below with respect to FIG. 2.

Figure 2:
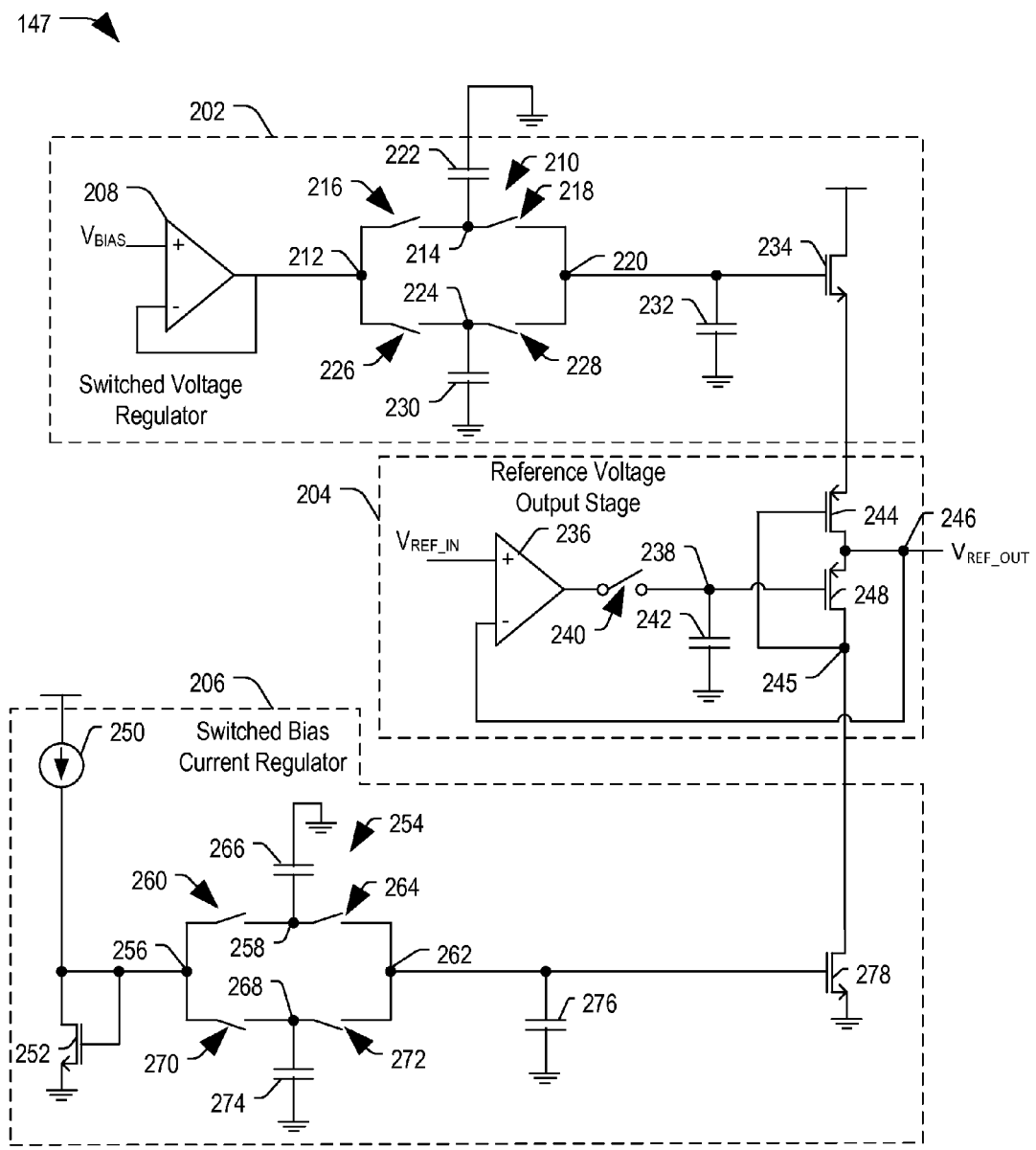
FIG. 2 is a circuit diagram of the clocked buffer of FIG. 1 according to an embodiment.

FIG. 2 is a circuit diagram of the clocked buffer 147 of FIG. 1 according to an embodiment. Clocked buffer 147 includes a switched voltage regulator 202, a reference voltage output stage 204, and a switched bias current regulator 206. The switched voltage regulator 202 may include an amplifier 208 including a first input configured to receive a bias voltage (labeled "$V_{BIAS}$"), a second input, and an output coupled to the second input and to a sampling network 210 at a node 212. Sampling network 210 may further include a switch 216 coupled between node 212 and a node 214. Sampling network 210 also may include a switch 218 coupled between node 214 and a node 220, a capacitor 222 coupled between node 214 and a power supply node, such as ground, and a switch 226 coupled between node 212 and a node 224. Sampling network 210 may further include a capacitor 230 coupled between node 224 and a power supply node, such as ground, and a switch 228 coupled between node 224 and node 220. Switched voltage regulator 202 may further include a capacitor 232 coupled between node 220 and a power supply node, such as ground. Switched voltage regulator 202 may also include a transistor 234, including a drain coupled to a power supply node, a gate coupled to node 220, and a source coupled to reference voltage output stage 204.

Reference voltage output stage 204 may include an amplifier 236 including a first input configured to receive a reference voltage input (labeled "$V_{REF\_IN}$"), a second input, and an output. Reference voltage output stage 204 may further include a switch 240 coupled between the output of amplifier 236 and a node 238, which may be coupled to a gate of transistor 248. Transistor 248 includes a source coupled to an output node 246 and a drain coupled to switched bias current regulator 206 and to node 245. Reference voltage output stage may also include a capacitor 242 coupled between node 238 and a power supply node, such as ground. Reference voltage output stage further includes a transistor 244 includes a source coupled to the source of transistor 234, a gate coupled to the drain of transistor 248, and a drain coupled to output node 246.

Switched bias current stage 206 includes a current source 250 configured to supply a current to a drain of a transistor 252, which includes a gate coupled to the drain and to a sampling network 254 at a node 256, and which includes a source coupled to a power supply node, such as ground. Sampling network 254 may include a switch 260 coupled between node 256 and a node 258, and a switch 264 coupled between node 258 and a node 262, which may be coupled to a gate of a transistor 278. Sampling network 254 may further include a capacitor 266 coupled between node 258 and power supply node, such as ground. Sampling network 254 also may include a switch 270 coupled between node 256 and a node 268, and a switch 272 coupled between node 268 and node 262. Sampling network 254 may also include a capacitor 274 coupled between node 268 and a power supply node, such as ground. Switched bias current stage 206 may further include a capacitor 276 coupled between node 262 and a power supply node, such as ground. Transistor 278 includes a drain coupled to the drain of transistor 248 and a source coupled to a power supply node, such as ground.

In an embodiment, switched voltage regulator 202 reduces noise that might otherwise be injected, in part, by sinking high frequency variations to ground through capacitors 222, 230 and 232. Further, switched voltage regulator 202 operates to improve the power supply rejection ratio. Additionally, switched bias current regulator 206 operates to reduce noise from the bias current generator. At the same time, reference voltage output stage 204 provides a stable reference voltage with a fast settling time that may be used in a high-speed switched signal path.

In an embodiment, switch 240 is closed during the ADC sampling phase, providing a voltage proportional to the reference voltage input ($V_{REF\_IN}$) to charge capacitor 242. During an ADC conversion phase, switch 240 is open, and the charge stored on capacitor 242 drives the gate of transistor 248. The voltage reference ($V_{REF}$) provided by reference voltage output stage 204 is in a closed-loop, and the loop has a settling time ($T_{Settle}$) to allow the voltage reference output ($V_{REF\_out}$) to equal the voltage reference input ($V_{REF\_IN}$) that is equal to approximately the number of extra cycles to track the input (M) divided by the conversion clock frequency ($f_{conv}$) according to the following equation:

$$T_{Settle} = \frac{M}{fconv} \quad (14)$$

When switch 240 is opened at the beginning of the ADC conversion phase, the charge on capacitor 242 provides a bias voltage for the gate of transistor 248. The charge on capacitor 242 drives the voltage reference output ($V_{REF\_OUT}$) on output node 246 open loop. Since the open loop topology does not include the amplifier 236 (since switch 240 is open), the reference voltage output ($V_{REF\_OUT}$) settles quickly during the conversion phase.

The charge on capacitor 232 and one of capacitors 222 and 230 provides a bias voltage for the gate of transistor 234 of switched voltage regulator 202. In a sampling phase, switch 216 is closed and switch 218 is closed, providing a stored charge from capacitor 222 to node 220. Also in the first phase, switch 228 is open and switch 226 is closed, storing charge from node 212 onto capacitor 230. In a second phase, switches 216 and 228 are closed, and switches 226 and 218 are open, storing charge from node 212 onto capacitor 222 and dumping charge from capacitor 230 into node 220. Thus, switching network 210 charges capacitor 222 while capacitor 230 is coupled to the gate of transistor 234, and vice versa. Since the alternating/switching operation of switching network 210 happens at the beginning of the sampling phase, the effect of errors or noise that is sampled onto capacitors 222, 230, and 232 is suppressed by the loop gain of amplifier 236 in reference voltage output stage 204 during the sampling phase.

Further, the bias point of transistor 278 may be held by capacitor 276 and by one of capacitors 266 and 274. Similar to the operation of switching network 210, switching network 254 couples capacitor 266 to node 256 to charge while coupling capacitor 274 to node 262 to bias the gate of transistor 278 during a first phase. During a second phase, switching network 210 couples capacitor 266 to node 262 to bias the gate of transistor 278 and couples capacitor 274 to node 256 to charge. Again, since the alternating/switching operation of switching network 254 happens at the beginning of the sampling phase, the effect of errors or noise that is sampled onto capacitors 266, 274, and 276 is also suppressed by the loop gain of amplifier 236 in reference voltage output stage 204 during the sampling phase.

As discussed above, switching networks 210 and 254 using a switching operation to alternately charge a capacitor and provide charge from a capacitor to a gate of a transistor. One example of the timing of the switching operation of the reference buffer is described below with respect to FIG. 3.

Figure 3:
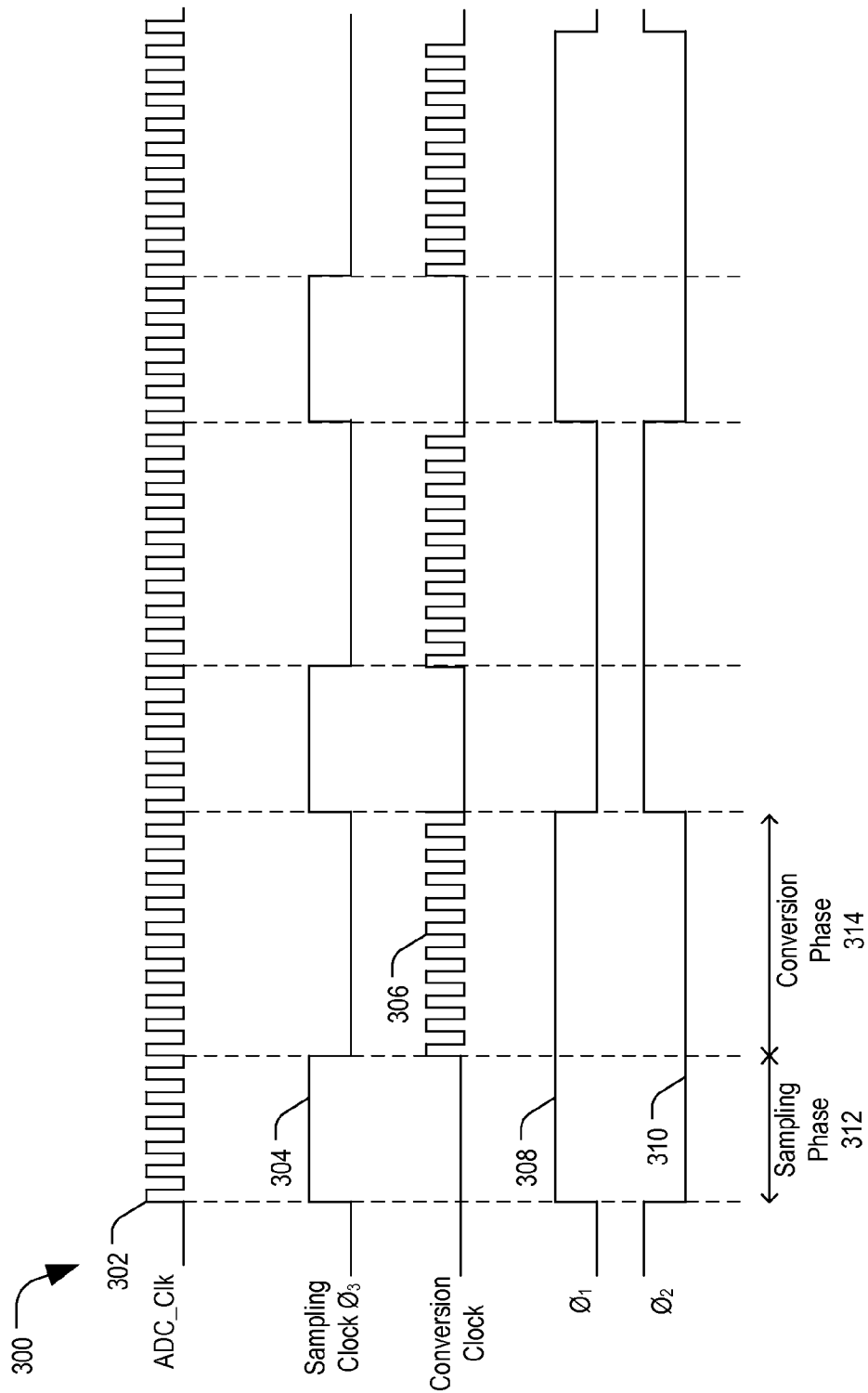
FIG. 3 is a timing diagram depicting clock and switch control signals in the clocked buffer of FIG. 2 during sampling and conversion phases.

FIG. 3 is a timing diagram 300 depicting clock and switch control signals in the clocked buffer 147 of FIGS. 1 and 2 during sampling and conversion phases. For ease of reference, sampling clock ($\varnothing_3$) refers to the clock signal that controls switching of switch 240. Signal ($\varnothing_1$) controls switches 218, 226, 264, and 270, and signal ($\varnothing_2$) controls switches 216, 228, 260, and 272.

Diagram 300 includes an ADC clock signal 302. At the beginning of a sampling phase 312, sampling clock ($\varnothing_3$) indicated at 304 transitions from a logic-low level to a logic-high level, closing switch 240 to charge capacitor 242. The sampling clock ($\varnothing_3$) remains at a logic high level throughout the sampling period 312. At the beginning of a conversion phase 314, sampling clock ($\varnothing_3$) 304 transitions from the logic-high level to the logic-low level, opening switch 240. Sampling clock ($\varnothing_3$) 304 remains at a logic-low level throughout the conversion phase 314, transitioning to a logic-high level at the beginning of the next sampling phase.

During sampling phase 312, conversion clock 306 remains at a logic-low level. During conversion phase 314, conversion clock 306 transitions in sync with the ADC clock 302. During sampling phase 312 and conversion phase 314, signal ($\varnothing_1$) 308 is at a logic-high level, closing switches 218, 226, 264 and 270, and signal ($\varnothing_2$) 310 is at a logic-low level, opening switches 216, 228, 260, and 272. In the next period including the next sampling phase and the next conversion phase, signal ($\varnothing_1$) 308 is at a logic-low level, opening switches 218, 226, 264 and 270, and signal ($\varnothing_2$) 310 is at a logic-high level, closing switches 216, 228, 260, and 272.

Thus, as illustrated by timing diagram 300, sampling clock ($\varnothing_3$) 304 closes switch 240 during sampling phase 312 and during subsequent sampling phases, while opening switch 240 during conversion phase 314 and subsequent conversion phases. Further, signals ($\varnothing_1$ and $\varnothing_2$) control switches 216, 218, 226, 228, 260, 264, 270, and 272 to provide the ping pong operation of switching networks 210 and 254, as discussed above. One possible example of a method of operating a clocked reference buffer is described below with respect to FIG. 4.

Figure 4:
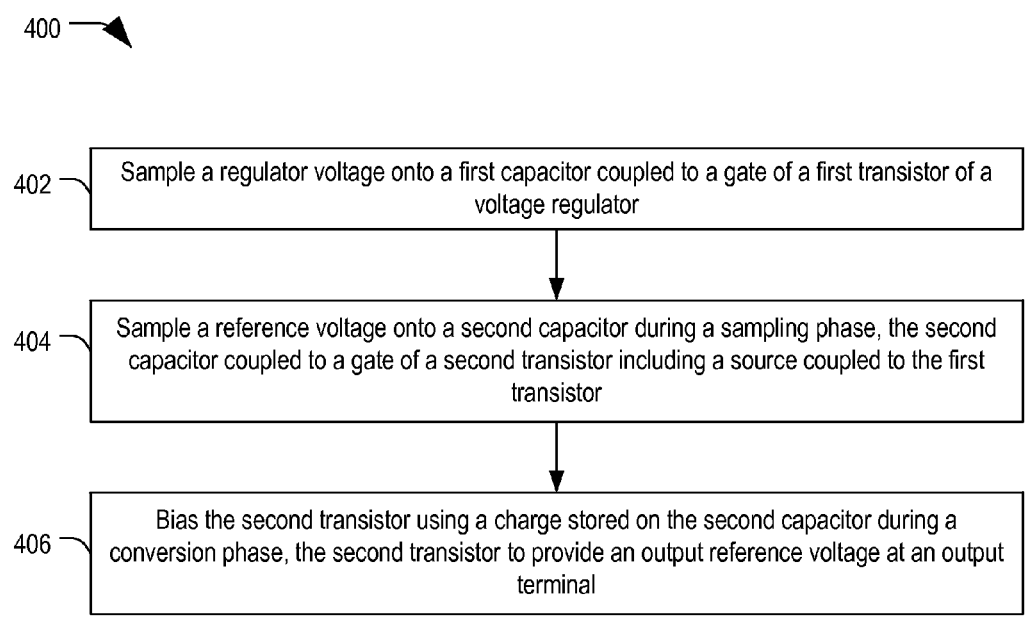
FIG. 4 is a flow diagram of a method of operating a clocked reference buffer according to an embodiment.

FIG. 4 is a flow diagram of a method 400 of operating a clocked reference buffer according to an embodiment. At 402, a regulator voltage is sampled onto a first capacitor coupled to a gate of a first transistor of a voltage regulator. In an embodiment, the regulator voltage is sampled during at least one of the sampling phase and the conversion phase.

At 404, a reference voltage is sampled onto a second capacitor during a sampling phase, where the second capacitor is coupled to a gate of a second transistor. In an embodiment, sampling the reference voltage includes biasing a switch to couple an output of an amplifier to the second capacitor during the sampling phase. Further, the amplifier includes a first input to receive a reference input signal and includes a second input coupled to the output terminal. In another embodiment, sampling the reference voltage further includes biasing the switch to decouple the amplifier output from the second capacitor during the conversion phase.

Continuing to 406, the second transistor is biased using a charge stored on the second capacitor during a conversion phase, where the second transistor provides an output reference voltage at an output terminal.

In an embodiment, during a first sample/conversion period, the regulator voltage is sampled onto the first capacitor by biasing a switching network. In an embodiment, the switching network alternately couples one of a pair of capacitors to the first capacitor to transfer charge to the first capacitor.

Further, during a second sample/conversion period, the regulator voltage is sampled onto the first capacitor by biasing the first switch to decouple the third capacitor to the regulator voltage, biasing the second switch to couple the third capacitor to the first capacitor, biasing the third switch to decouple the fourth capacitor from the first capacitor, and biasing the fourth switch to couple the fourth capacitor to the regulator voltage.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. A voltage reference circuit comprising:
    a first transistor including a source coupled to an output node configured to provide a reference voltage, and including a gate, and a drain;
    a capacitor coupled to the gate;
    a switch configured to selectively provide a voltage to the capacitor during a first phase of an analog-to-digital converter (ADC) conversion operation and to decouple the voltage from the capacitor during a second phase of the ADC conversion operation; and
    a bias current regulator circuit coupled to the drain of the first transistor and configured to control a bias current at the drain of the transistor.

2. The voltage reference circuit of claim 1, further comprising an amplifier including a first input configured to receive a reference voltage input signal, a second input coupled to the output node, and an output coupled to the switch.

3. The voltage reference circuit of claim 1, wherein the switch is responsive to a first control signal to close during the first phase to sample a voltage at the output of the amplifier onto the capacitor and is responsive to a second control signal to open during the second phase to bias the first transistor based on a charge stored by the capacitor.

4. The voltage reference circuit of claim 1, wherein the bias current regulator circuit comprises:
a first bias transistor including a drain and a gate coupled to a current source and including a source coupled to a power supply node;
a sampling network including an input coupled to the drain of the first bias transistor and including an output;
a bias capacitor coupled to the output of the sampling network; and
a second bias transistor including a drain coupled to the drain of the first transistor, a gate coupled to the bias capacitor, and a source coupled to the power supply node.

5. The voltage reference circuit of claim 1, further comprising a second transistor including a source coupled to a voltage regulator, a gate coupled the drain of the first transistor, and a drain coupled to the output node.

6. The voltage reference circuit of claim 5, wherein the voltage regulator is configured to sample a voltage onto a regulator capacitor and to provide a regulated voltage to the source of the second transistor based on a charge stored by the regulator capacitor.

7. A method of providing a reference voltage, the method comprising:
closing a switch during a sampling phase of an analog-to-digital converter (ADC) conversion operation to sample a voltage onto a capacitor of an output stage by biasing a switch to couple an output of an amplifier to the capacitor during the first phase, the capacitor coupled to a gate of a transistor that is coupled to an output node, the amplifier including a first input to receive a reference input signal and including a second input coupled to the output node; and
opening the switch during a conversion phase of the ADC conversion operation to isolate the capacitor from the voltage; and
biasing the transistor using charge stored on the capacitor to provide the reference voltage at the output node during the conversion phase.

8. The method of claim 7, further comprising:
selectively activating one of a first current flow path and a second current flow path to provide a regulator voltage to a capacitor of a voltage regulator that is coupled to a gate of a regulator transistor; and
biasing the regulator transistor using charge stored on the capacitor to produce a regulator current; and
providing the regulator current to the output stage.

9. The method of claim 8, wherein selectively activating one of the first current flow path and the second current flow path comprises activating the first current flow path during the sampling phase.

10. The method of claim 7, further comprising:
sampling a charge onto a capacitor that is coupled to a gate of a transistor of a bias current output stage; and
biasing a gate of a transistor of the bias current output stage that is coupled to the output stage using the charge stored on the capacitor to provide a bias current to the output stage.

11. The method of claim 7, wherein decoupling the voltage from the capacitor comprises biasing the switch to decouple the amplifier output from the capacitor during the second phase.

12. The method of claim 7, further comprising:
receiving a reference voltage input signal at a first input of a differential amplifier;
receiving the reference voltage from the output node; and
generating the voltage as a difference between the reference voltage input signal and the reference voltage from the output node.

13. The method of claim 12, wherein the switching network alternately couples the first path and the second path to the second capacitor of the voltage regulator circuit during the first and second phases, respectively.

14. A reference circuit comprising:
a reference voltage output stage including:
a transistor including a drain coupled to an output node, and including a gate and a source;
a capacitor coupled to the gate; and
a switch coupled to the capacitor and configured to selectively couple a voltage to the capacitor during a sampling phase of an analog-to-digital conversion (ADC) operation;
wherein a charge stored on the capacitor biases the gate of the transistor to provide a regulated voltage on the output node during a conversion phase of the ADC operation; and
a voltage regulator circuit coupled to the source of the transistor of the reference voltage output stage and configured to provide a regulated voltage to the source.

15. The reference circuit of claim 14, wherein the reference voltage output stage further comprises:
an amplifier including a first input configured to receive a reference voltage input signal, a second input coupled to the output node, and an output configured to be coupled to the capacitor through the switch.

16. The reference circuit of claim 14, wherein the voltage regulator circuit comprises:
a second transistor including a source coupled to a supply voltage, and including a gate and a drain, the drain coupled to the source of the transistor of the reference voltage output stage;
a second capacitor coupled to the gate of the second transistor; and
a switching network to selectively deliver charge to the second capacitor during the sampling phase;
wherein charge stored by the second capacitor biases the second transistor to provide the regulated voltage to the reference voltage output stage during the conversion stage.

17. The reference circuit of claim 16, wherein the switching network of the voltage regulator circuit includes at least one capacitor.

18. The reference circuit of claim 14, further comprising a bias current circuit including:
a second transistor including a drain coupled to the reference voltage output stage, and includes a gate and a drain, the source coupled to a supply voltage;
a second capacitor coupled to the gate of the second transistor; and
a switching network to selectively deliver charge to the second capacitor during the sampling phase;
wherein charge stored by the second capacitor biases the second transistor to provide a bias current to the reference voltage output stage during the conversion stage.

19. The reference circuit of claim 18, wherein the switching network of the bias current circuit includes at least one capacitor.

* * * * *